US012785419B2

(12) United States Patent
Lupper et al.

(10) Patent No.: US 12,785,419 B2
(45) Date of Patent: Nov. 3, 2026

(54) SYSTEMS AND METHODS FOR A CONNECTED CHARGER HAVING A COMMUNICATIONS MODULE

(71) Applicant: Hilti Aktiengesellschaft, Schaan (IL)

(72) Inventors: Alfred Lupper, Aystetten (DE); Wolfgang Schaur, Fuchstal (DE); Harishkumar Srinivasan Ravikumar, Munich (DE); Johannes Kerler, Walkertshofen (DE)

(73) Assignee: Hilti Aktiengesellschaft, Schaan (LI)

( * ) Notice: Subject to any disclaimer, the term of this patent is extended or adjusted under 35 U.S.C. 154(b) by 738 days.

(21) Appl. No.: 18/056,131

(22) Filed: Nov. 16, 2022

(65) Prior Publication Data

US 2024/0162720 A1 May 16, 2024

(51) Int. Cl.
*H02J 7/00* (2026.01)
*G01R 31/382* (2019.01)
*H02J 7/40* (2026.01)
*H02J 7/44* (2026.01)

(52) U.S. Cl.
CPC ............ *H02J 7/445* (2026.01); *G01R 31/382* (2019.01); *H02J 7/44* (2026.01)

(58) Field of Classification Search
USPC .......................................................... 320/107
See application file for complete search history.

(56) References Cited

U.S. PATENT DOCUMENTS 9,813,110 B2 * 11/2017 Glauning ................. H04B 3/02
10,124,455 B2 * 11/2018 Ito ............................. B25F 5/00
10,389,139 B2 * 8/2019 Velderman ................ H02J 3/36
2014/0158389 A1 * 6/2014 Ito ............................. B25F 5/00 173/46
2014/0339922 A1 11/2014 Glauning
(Continued)

FOREIGN PATENT DOCUMENTS

EP 3687024 7/2020
EP 3996233 5/2022
(Continued)

OTHER PUBLICATIONS

U.S. Appl. No. 18/056,135, filed Nov. 16, 2022, Lupper et al.
(Continued)

*Primary Examiner* — Samuel Berhanu

(74) *Attorney, Agent, or Firm* — Grüneberg Global IP, PLLC

(57) ABSTRACT

A system includes a first battery pack configured to receive and gather power tool information and/or battery pack information. The system includes a connected charger configured to removably couple with the first battery pack to charge or recharge the first battery pack via a first interface. The connected charger includes a memory configured to receive the power tool information and/or the first battery pack information via the first interface. The connected charger includes a communications module disposed within the housing of the connected charger. The communications module is configured to transmit the received power tool and/or the received first battery pack information to a cloud-based computing system during a period of time when the first battery pack is disconnected from the first interface.

15 Claims, 4 Drawing Sheets

(56) References Cited

U.S. PATENT DOCUMENTS

| | | | |
|---|---|---|---|
| 2019/0157881 A1 | 5/2019 | Velderman et al. | |
| 2019/0280502 A1* | 9/2019 | Hsieh | B60L 53/60 |
| 2022/0094181 A1* | 3/2022 | Böhm | H01M 10/44 |
| 2022/0102767 A1 | 3/2022 | Böhm et al. | |
| 2022/0102989 A1 | 3/2022 | Bohm et al. | |
| 2022/0102991 A1 | 3/2022 | Bohm et al. | |
| 2024/0162719 A1 | 5/2024 | Lupper et al. | |
| 2024/0162732 A1 | 5/2024 | Lupper et al. | |

FOREIGN PATENT DOCUMENTS

| | | |
|---|---|---|
| WO | 2021/110459 | 6/2021 |
| WO | 2021/110460 | 6/2021 |
| WO | 2021/110461 | 6/2021 |

OTHER PUBLICATIONS

U.S. Appl. No. 18/056,123, filed Nov. 16, 2022, Lupper et al.

Office Action received for U.S. Appl. No. 18/056,135, mailed on Aug. 12, 2025, 18 pages.

* cited by examiner

SYSTEMS AND METHODS FOR A CONNECTED CHARGER HAVING A COMMUNICATIONS MODULE

BACKGROUND OF THE INVENTION

Field of the Invention

The present disclosure relates generally to the field of power tools, and more particularly to a charging device that includes a communications module for use within a tool system.

Description of Related Art

Electrical devices, such as corded or cordless power tools, may be useful in typical construction job sites. Typically, electrical devices include a motor drive and control circuitry for controlling the motor drive. Certain corded power tools may draw power from a fixed power source, while certain cordless power tools may draw power from a rechargeable power source (e.g., rechargeable battery pack). In certain situations, it may be beneficial to have wireless communications between the power tool and various other components on the construction job site and/or to remote computing devices. However, some power tools may not be equipped with such wireless communications.

Accordingly, it may be beneficial to provide systems and methods for communications for use within a power tool system. Specifically, it may be beneficial to provide for systems and methods for a charging device having a communications module. The charging device may recharge one or more battery packs and may enable bidirectional communication of information between power tools, battery packs, and remote computing devices.

SUMMARY OF THE INVENTION

Certain embodiments commensurate in scope with the originally described subject matter are summarized below. These embodiments are not intended to limit the scope of the described subject matter, but rather these embodiments are intended only to provide a brief summary of possible forms of the subject matter. Indeed, the subject matter may encompass a variety of forms that may be similar to or different from the embodiments set forth below.

In a first embodiment, a system includes a first battery pack configured to receive and gather power tool information and/or battery pack information. The system includes a connected charger configured to removably couple with the first battery pack to charge or recharge the first battery pack via a first interface. The connected charger includes a memory configured to receive the power tool information and/or the first battery pack information via the first interface. The connected charger includes a communications module disposed within the housing of the connected charger. The communications module is configured to transmit the received power tool and/or the received first battery pack information to a cloud-based computing system during a period of time when the first battery pack is disconnected from the first interface.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION OF THE INVENTION

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

Present embodiments are directed to a connected charger configured for use within a power tool system on a construction job site. Specifically, the connected charger includes a communications module that is configured to receive and/or transmit information between a battery pack and remote computing devices (e.g., a cloud-based computing system). In certain embodiments, the connected charger may be configured to receive and/or transmit information between a plurality of battery packs and the remote computing devices. In certain embodiments, the communications module is a cellular transceiver that receives and/or transmits the information via a cellular antenna to a cloud-based computing system. Specifically, in certain embodiments, the connected charger is configured to store information from a plurality of battery packs and/or power tools, and may be configured to transmit the information at a desired time. In certain embodiments, the connected charger may be configured to collect and store information from the plurality of battery packs and/or power tools over a period of time where wireless communications are not possible or unavailable.

Figure 1:
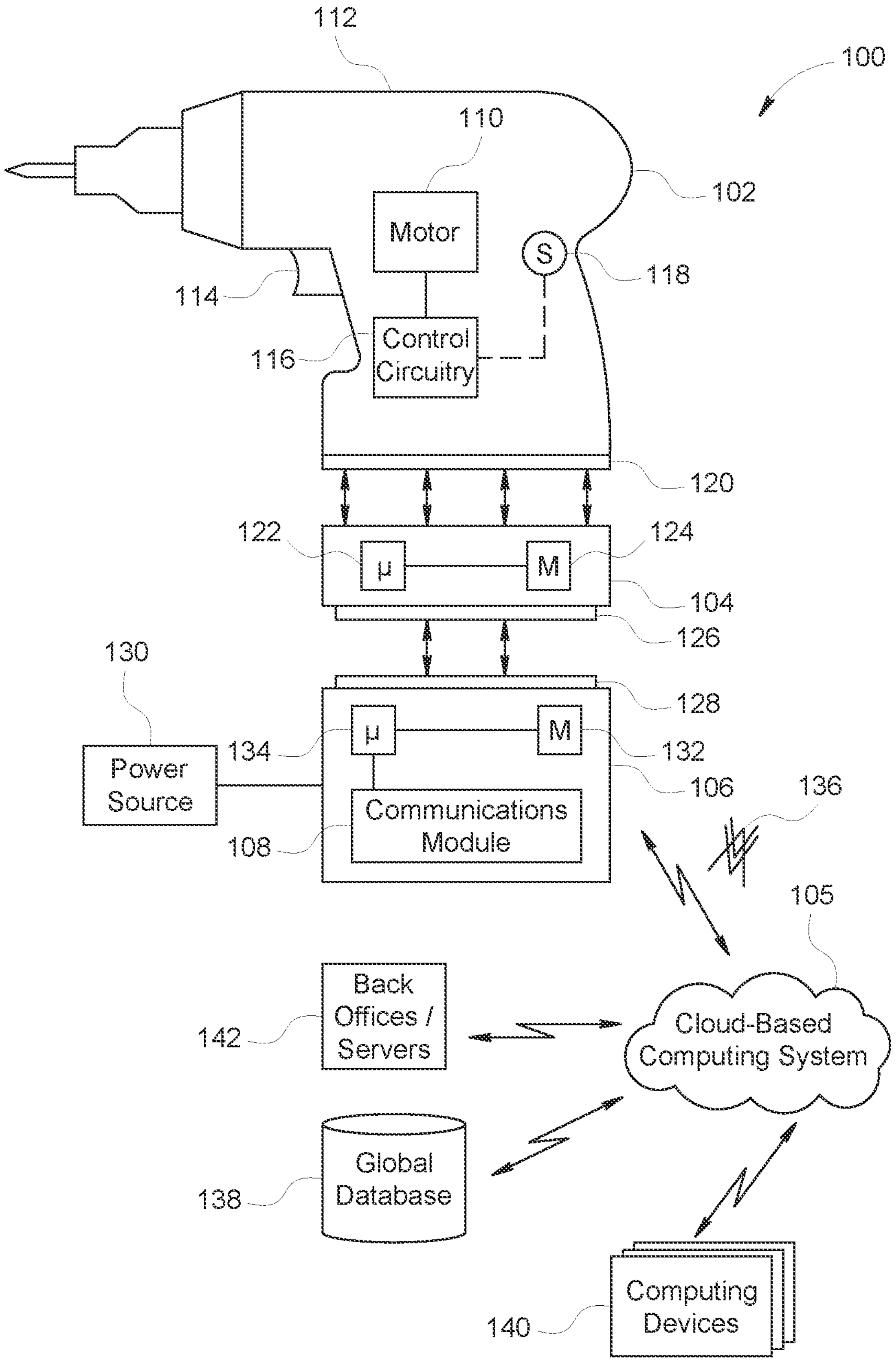
FIG. 1 is a block diagram of an embodiment of a power tool system having a power tool, a battery pack, and a connected charger for charging the battery pack, where the connected charger includes a communications module for transmitting or receiving information between the battery pack and a cloud-based computing system, in accordance with aspects of the present disclosure.

FIG. 1 is a block diagram of an embodiment of a power tool system 100 having a power tool 102, a battery pack 104, and a connected charger 106 for charging the battery pack 104. In the illustrated embodiments, the connected charger 106 includes a communications module 108 for transmitting and/or receiving information between the battery pack 104 and a computing or control system (such as, but not limited to, a cloud-based computing system) 105, in accordance with aspects of the present disclosure. In certain embodiments (not shown), the communications module 108 may be a separate module that is independent from the connected charger 106.

In certain embodiments, the power tool 102 may be a cordless power tool configured to receive power from the battery pack 104. In certain embodiments, the power tool 102 includes a motor 110, a housing assembly 112, a trigger 114, and control circuitry 116 that is configured to control one or more components of the power tool 102. In certain embodiments, the power tool 102 includes one or more sensors 118, such as, for example, safety sensors, position and/or orientation sensors, touch sensors, pressure sensors, accelerometers, temperature sensors, proximity and displacement sensors, image sensors, level sensors, gyroscopes, force sensors, speed sensors, etc. The one or more sensors 118 may be configured to gather operating, safety, or historical information about the power tool 102.

The battery pack 104 may be removably coupled with the power tool 102 via a tool interface 120. In the illustrated embodiment, the motor 110 is configured to receive power from the battery pack 104, thereby enabling the power tool 102 with a cordless capability. In certain embodiments, the trigger 114 and the motor 110 may be communicatively coupled to the control circuitry 116, and engaging various functions of the trigger 114 may enable functionality of the power tool 102. For example, engaging the "ON" or "OFF" features of the trigger 114 may provide an input to the control circuitry 116, which in turn may provide drive signals to the motor 110.

In certain embodiments, the control circuitry 116 is configured to gather power tool information (e.g., operational, safety, historical information) from the one or more sensors 118, the motor 110, the trigger 114, or other component of the power tool 102. In certain embodiments, engaging the "ON" or "OFF" features of the trigger 114 may indicate to the control circuitry 116 to transmit operational information related to the power tool 102 to the battery pack 104. Specifically, the information may be communicated via a wired connection through the tool interface 120. For example, in certain embodiments, upon engaging the trigger 114 to turn "OFF" the power tool 102, the control circuitry 116 may be configured to transmit historical operating parameters related to the power tool 102 to the battery pack 104. As a further example, in certain embodiments, upon engaging the trigger 114 to turn "ON" the power tool 102, the control circuitry 116 may be configured to transmit real-time operating parameters related to the power tool 102 to the battery pack 104. In certain embodiments, sensor feedback from the one or more sensors 118 (e.g., a touch wake-up detected by the sensor 118) may result in tool "wake-up," causing the control circuitry 116 to transmit operating parameters related to the power tool 102 to the battery pack 104.

In certain embodiments, operational parameters related to the power tool 102 may include, but are not limited to, unique identification information related to the power tool 102, unique identification information related to the manufacturer, owner, and/or previous owners of the power tool 102, historical information related to the operation of the power tool 102 (e.g., runtime), error codes or alerts triggered by the power tool 102, historical information related to the repair and/or theft of the power tool 102, sensor related information gathered from one or more sensors 118 disposed throughout the power tool 102, information related to the components of the power tool 102, drive signals provided by the control circuitry 116 and/or input signals provided by the trigger 114, historical or future maintenance or repairs for the power tool 102, and/or the general state of the health of the power tool 102.

In certain embodiments, the housing assembly 112 may include a housing body, a handle, and the tool interface 120 between the power tool 102 and the battery pack 104. As noted above, in certain embodiments, the battery pack 104 may be a rechargeable battery pack that is removably coupled to the power tool 102 via the tool interface 120. The rechargeable battery pack may be a lithium-ion battery pack of various specifications. In particular, the battery pack 104 may be an interchangeable device, that may be configured for use with a plurality of power tools. The interface 120 may enable the battery pack 104 to be communicatively coupled to the power tool 102. For example, the interface 120 may include one or more contact points that allow power to be transferred between the battery pack 104 and the power tool 102. Further, the tool interface 120 may include one or more contact points that allow the transfer of information (e.g., communications) between the control circuitry 116 of the power tool 102 and the battery pack 104.

In certain embodiments, the battery pack 104 may include control circuitry μ (e.g., a microprocessor, integrated circuit, etc) 122 and communications circuitry. In certain embodiments, the control circuitry 122 of the battery pack 104 receives information related to the power tool 102 from the control circuitry 116 of the power tool 102. Further, in certain embodiments, the control circuitry 122 of the battery pack 104 may gather information (e.g., operational, safety, historical information, etc.) related to the battery pack 104, such as, but not limited to, unique identification information related to the battery pack 104, historical information related to the operation of the battery pack 104 (e.g., cycles of operation, remaining power, etc.), state of health (SOH) status and/or state of charge (SOC) status of the battery pack 104, error codes triggered by the power tool 102, and/or status of the battery pack 104 (e.g., battery lock down status). Accordingly, in certain embodiments, the communications circuitry 122 may store information related to both the power tool 102 and the battery pack 104 within the memory (M) 124.

In certain embodiments, the battery pack 104 may be removably coupled to the connected charger 106 to recharge the battery pack 104. In certain embodiments, the battery pack 104 may include a battery interface 126 that is configured to removably couple with the connected charger interface 128 of the connected charger 106. In certain embodiments, the interfaces 126, 128 may include one or more features that help guide, engage, or secure the battery pack 104 to the connected charger 106. The one or more features may include various ridges, rails, guides, tabs, buttons, clips, or any other fastening or securing features known in the art to securely and removably couple the battery pack 104 to the connected charger 106. In certain embodiments, the connected charger 106 may be utilized with one or more battery packs 104, as further described with respect to FIG. 2. The battery pack 104 may be configured to receive power through the charging interfaces 126, 128. In turn, the connected charger 106 may be configured to receive power via a power source 130, such as a power outlet and/or direct power source.

In certain embodiments, the connected charger 106 includes the communications module 108, which may be a cellular transceiver. In particular, the connected charger 106 may include one or more terminals or contact points to transfer information (e.g., communications) through a wired connection to and from the battery pack 104, as further described with respect to FIGS. 3 and 4. The connected charger 106 may include a processor p 134 and a memory (M) 132. The processor 134 may be configured to execute instructions stored on the memory 132 to carry out the functions of the communications module 108. The memory 132 may be configured to store instructions that are loadable and executable on the processor 134. In certain embodiments, the memory 132 may be volatile (such as a random access memory (RAM)) and/or non-volatile (such as read-only memory (ROM), flash memory, etc.). In some implementations, the memory 132 may include multiple different types of memory, such as static random access memory (SRAM), dynamic random access memory (DRAM), or ROM. In certain embodiments, the memory 132 may be utilized to store information received from one or more battery packs 104 before the information is uploaded to a control system such as the cloud-based computing system 105.

In certain embodiments, the communications module 108 may be configured to transmit the information (e.g., information related to the power tool 102 and/or information related to the battery pack 104) to the cloud-based computing system 105 via the antenna 136. After receiving information from one or more battery packs 104, the communications module 108 may store, process and/or transmit the information. For example, in certain embodiments, the connected charger 106 may be configured to receive information from a first battery pack 104 and may store the information within a memory 132 of the connected charger 106. Further, the first battery pack 104 may be disconnected or disengaged from the connected charger 106 and a second battery pack 104 may be connected and engaged with the connected charger 106. After the connected charger 106 receives and stores information from the second battery pack 104, the connected charger 106 may be configured to transmit information (e.g., battery pack information and/or power tool information) from the first battery pack via the communications module 108 to the cloud-based computing system 105. In certain embodiments, the connected charger 106 may transfer a history of information from all previously connected battery packs 104, such as information from both the first and second battery packs. In certain embodiments, the connected charger 106 may selectively transfer information associated with a particular battery pack 104 or power tool 102 and/or a particular group of battery packs 104 or power tools 102. In certain embodiments, the connected charger 106 may transfer information instantaneously while in other embodiments, the connected charger 106 may transfer information in bulk or at a desired time or moment.

By utilizing cellular communications, the connected charger 106 may omit various additional devices on the construction site typically used as a gateway, such as a mobile phone, tablet, computer or other processor-enabled devices that act as a gateway. Further, while the following embodiments are described with respect to cellular communications, it should be noted that other forms of wireless communications may be utilized to transmit information to the cloud-based computing system 105, such as satellite, UHF, VHF, WLANs, Wi-Fi, and so forth.

Figure 4:
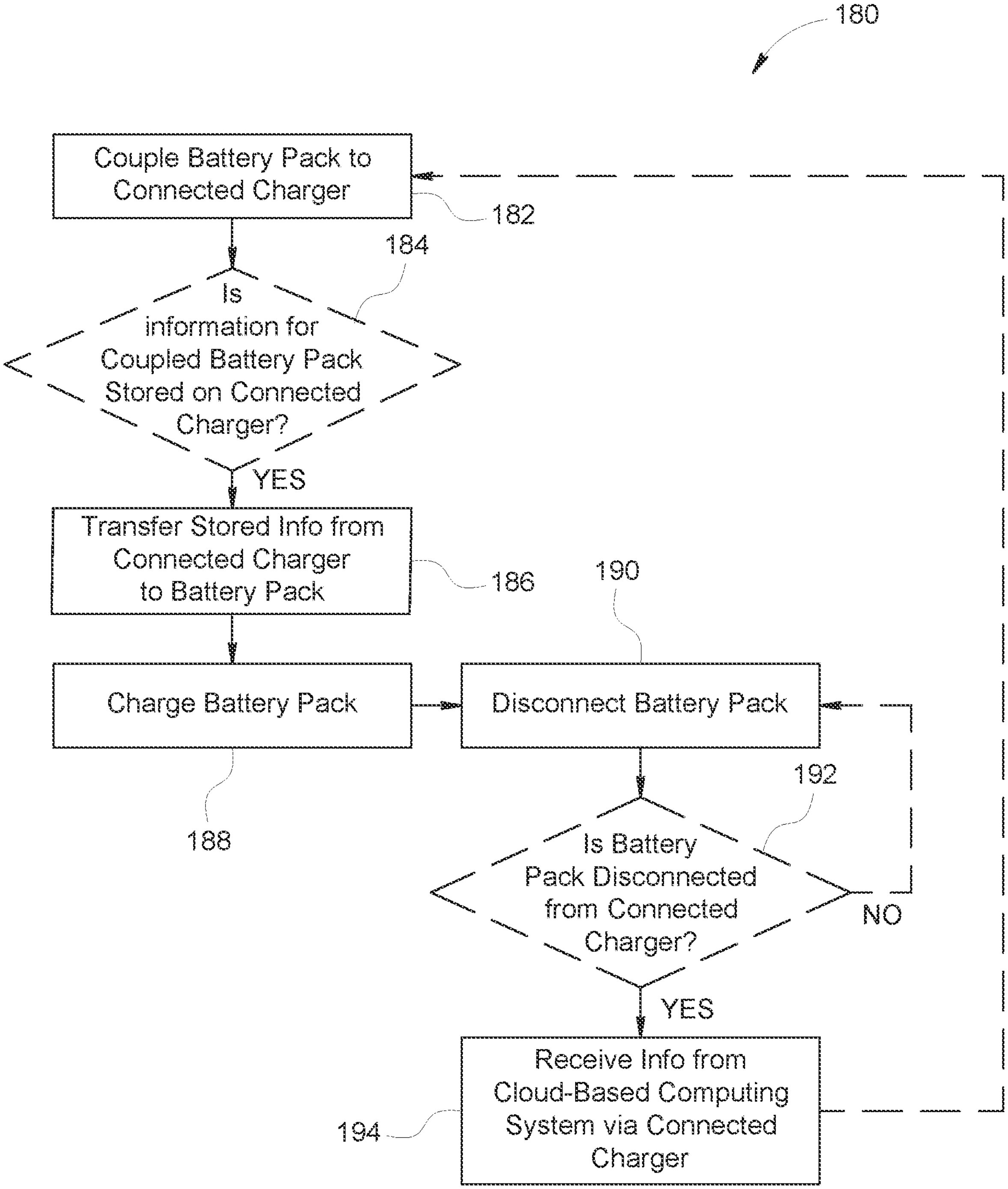
FIG. 4 is an embodiment of a method for receiving information from the cloud-based computing system and transmitting it to the battery pack via the connected charger of FIG. 1, in accordance with aspects of the present disclosure.

In certain embodiments, the cloud-based computing system 105 may be configured to transmit information to the communications module 108, which may be transferred to and implemented within the desired battery pack 104 or power tools 102, as further described with respect to FIG. 4. For example, in certain embodiments, the cloud-based computing system 105 may transmit information (e.g., firmware, configurations, updates, packages, etc.)

In certain embodiments, the cloud-based computing system 105 may be a service provider providing cloud analytics, cloud-based collaboration and workflow systems, distributed computing systems, expert systems and/or knowledge-based systems. In certain embodiments, the cloud-based computing system 105 may be a data repository that is coupled to an internal or external global database 138. Further, in certain embodiments, the global database 138 may allow computing devices 140 to retrieve information stored within for additional processing or analysis. Indeed, the cloud-based computing system may be accessed by a plurality of systems (computing devices 140 and/or computing devices from back offices/servers 142) from any geographic location, including geographic locations remote from the physical locations of the systems. Accordingly, the cloud-based computing system 105 may enable advanced collaboration methods between parties in multiple geographic areas, provide multi-party workflows, data gathering, and data analysis, which may increase the capabilities the battery pack 104 and/or the power tool 102.

Figure 2:
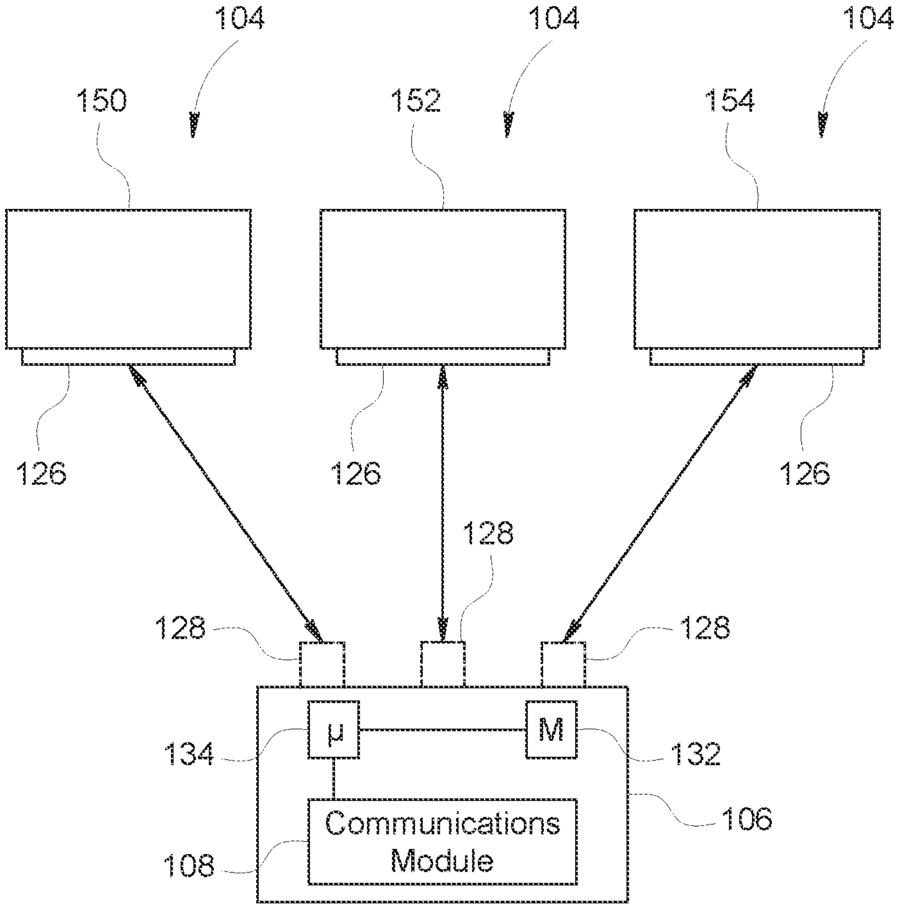
FIG. 2 is a block diagram of an embodiment of the power tool system of FIG. 1, where the power tool system includes one or more battery packs utilized with the connected charger, in accordance with aspects of the present disclosure.

FIG. 2 is a block diagram of an embodiment of the power tool system 100 of FIG. 1, where the power tool system 100 includes one or more battery packs 102 utilized with the connected charger 106, in accordance with aspects of the present disclosure. As noted above, in certain embodiments, the battery pack 104 may include a battery interface 126 that is configured to removably couple with the connected charger interface 128 of the connected charger 106. In certain embodiments, the connected charger 106 may include a plurality of connected charger interfaces 128, each of which is configured to removably couple with a battery pack 104. Accordingly, one or more battery packs 104 (each of which may each correlate to one or more different power tools 102) may be utilized with the same connected charger 106. In this manner, one connected charger 106 may be utilized to charge, at different times or at the same time, a plurality of battery packs 104. Furthermore, the connected charger 106 may be utilized to receive, at different times or at the same time, information from a plurality of battery packs 104.

As an example, in certain embodiments, each of the battery packs 104 (e.g., the first battery pack 150, the second battery pack 152, and the third battery pack 154) may be configured to transfer information to the connected charger 106. Accordingly, in certain embodiments, the connected charger 106 may be configured to store information (e.g., operating parameters related to the power tool 102 and/or operating parameter information related to each battery pack 104) within the memory 132. In particular, the connected charger 106 may associate the information stored with the specific power tool 102 and battery pack 104 combination. In certain embodiments, the connected charger 106 may be configured to transmit this information to the cloud-based computing system 105 via the communications module 108 (e.g., cellular transceiver) and the antenna 136. In certain embodiments, the connected charger 106 may include a delay before transmitting information received from one or more battery packs 104. The delay may be determined by current charging operations of the connected charger 106 (such as if one or more battery packs 106 are currently coupled and transmitting information to the connected charger 106), the amount of information stored within the memory 132, availability of wireless communications, strength of signal for available communications channels, duration of time that has passed since the previous transmission or any combination of these factors.

Figure 3:
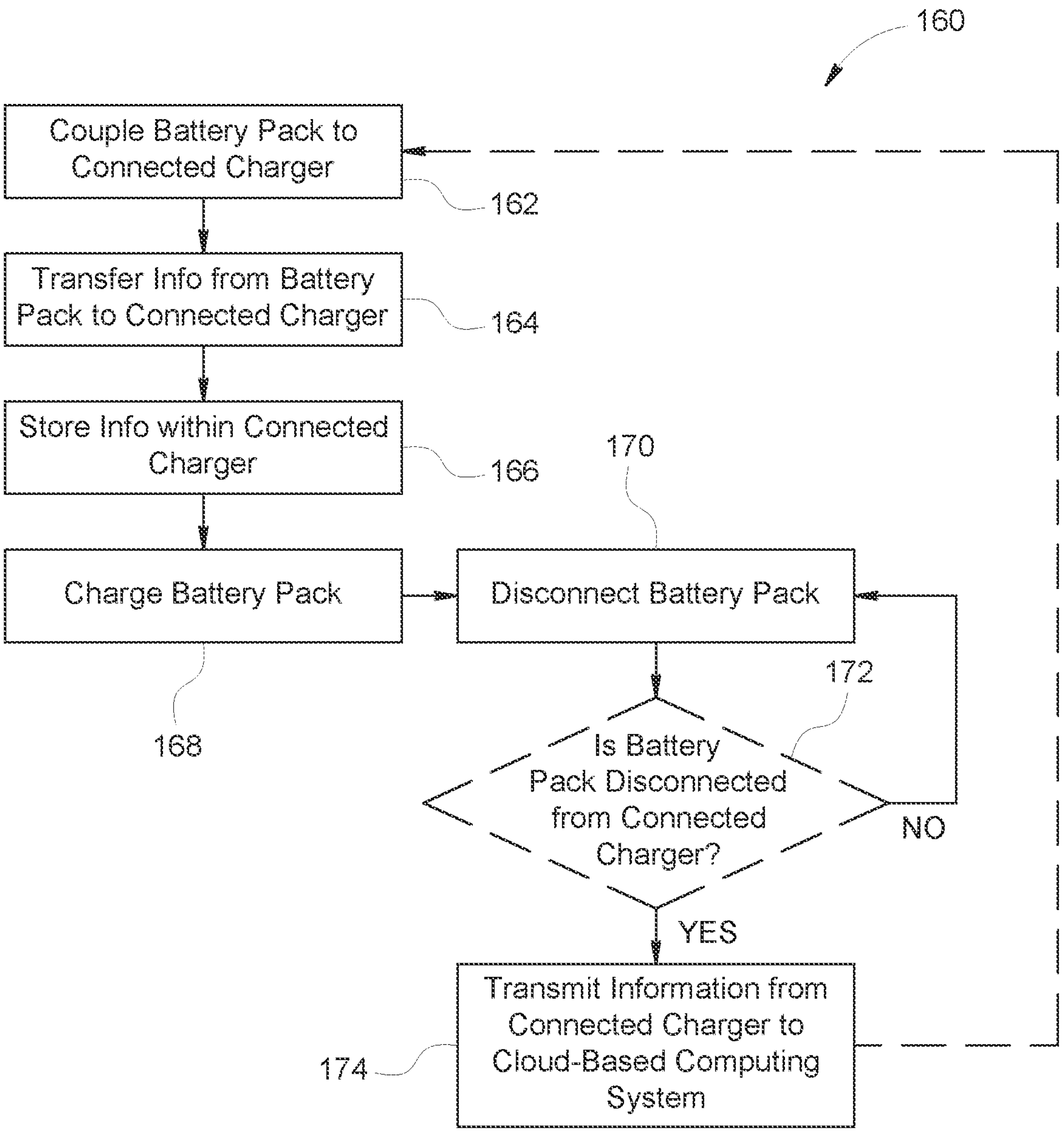
FIG. 3 is an embodiment of a method for transmitting information obtained from the battery pack to a cloud-based computing system via the connected charger of FIG. 1, in accordance with aspects of the present disclosure.

FIG. 3 is an embodiment of a method 160 for transmitting information obtained from one or more battery packs 102 to the cloud-based computing system 105 via the connected charger 106 of FIG. 1, in accordance with aspects of the present disclosure.

The method 160 includes removably coupling or engaging the battery pack 104 to the connected charger 106 (block 162). The connected charger 106 includes the communications module 108 that may be a cellular transceiver configured for bidirectional transfer of information between the battery pack 104 and the cloud-based computing system 105. In certain embodiments, removably coupling the battery pack 104 may include guiding the battery interface 126 to mate with the connected charger interface 128 via one or more features that help guide, engage, or secure the battery pack 104 to the connected charger 106. The one or more features may include various ridges, rails, guides, tabs, buttons, clips, or any other fastening or securing features known in the art to securely and removably couple the battery pack 104 to a charging device. In certain embodiments, one or more battery packs 104 may be removably coupled to the connected charger 106 either simultaneously or consecutively.

In certain embodiments, the method 160 includes transferring information (e.g., operating, safety, historical or predicted information related to one or more power tools 102 and/or battery packs 104) from the battery pack 104 to the connected charger 106 (block 164). The information may be transferred through a contact connection between the battery pack interface 126 and the connected charger interface 128. As noted above, the battery pack 104 may be configured to transmit operating parameters related to the power tool 102 and/or operating parameter information related to the battery pack 104 to the connected charger 106. In certain embodiments, the connected charger 106 may receive and store information from a plurality of battery packs 104, each of which may include information related to a plurality of power tools 102. In certain embodiments, the connected charger 106 may be configured to store the information (block 166). In certain embodiments, the connected charger 106 may be configured to store information from a plurality of battery packs 104 related to a plurality of power tools 102.

The method 160 includes charging the battery pack 104 via the connected charger 106 (block 168). It should be noted that in certain embodiments, the connected charger 106 may charge the battery pack 104 at any time the battery pack 104 is removably coupled to the connected charger 106. In certain embodiments, the connected charger 106 may be configured to charge the battery pack 104 after information from the battery pack 104 is transferred to the connected charger 106.

The method 160 further includes disconnecting (or disengaging) the battery pack 104 from the connected charger 170 (block 170). In certain embodiments, the method 160 includes determining if the battery pack 104 is securely disengaged from the connected charger 106 (block 172) as a safety check and/or as a status check (block 172). If the battery pack 104 is not securely disconnected from the connected charger 106, the connected charger 106 may check again until the battery pack 104 is securely disengaged.

In certain embodiments, the method 160 includes transmitting the information (e.g., operating, safety, historical or predicted information related to one or more power tools 102 and/or battery packs 104) from the battery pack 104 to the connected charger 106 (block 174). In particular, the connected charger 106 may be configured to transmit information based on one or more transmission factors, which include, but are not limited to: current charging operations of the connected charger 106 (such as the number of battery packs 106 currently coupled to the connected charger 106 for charge or information transfer), the amount of information stored within the memory 132, availability of memory within the memory 132, availability of wireless communications, strength of signal for certain communications channels, duration of time that has passed since the previous transmission, etc. In certain embodiments, the connected charger 106 may be configured to gather information from a plurality of battery packs 104 before transmitting this information in bulk to the cloud-based computing system 105. In certain embodiments, the connected charger 106 may be configured to transmit information for a battery pack 104 that is not connected to the connected charger 106 at the time of transmission.

In certain embodiments, the method 160 includes transmitting the information (e.g., operating, safety, historical or predicted information related to one or more power tools 102 and/or battery packs 104) from the connected charger 106 to the cloud-based computing system 105 via the communications module 108 (e.g., cellular transceiver) and the antenna 136 (block 174). In particular, by including cellular communication capabilities within the communications module 108, the tool system 100 may operate without devices traditionally needed to transmit information to a remote cloud-based computing system (such as mobile phones, tablets, computers or other processor-enabled devices that act as a gateway).

In certain embodiments, the method 160 includes removably recoupling one or more battery packs 104 to the connected charger 106 to gather additional information (block 162). In this manner, the connected charger 106 may gather information from a plurality of power tools 102 and/or battery packs 104. In certain embodiments, the connected charger 106 may be configured to group or organize information collected based on grouping factors, such as, but not limited to: geographical location of power tools 102, operator, job site, age of power tool 102, predictive maintenance required, duration of operation, amount of charge left in battery pack 104, etc. In certain embodiments, the method 160 includes transmitting the information from the connected charger 106 to the cloud-based computing system 105 based on one or more of these grouping factors.

FIG. 4 is an embodiment of a method 180 for receiving information from the cloud-based computing system 105 and transmitting it to the desired battery pack 104 via the connected charger 106 of FIG. 1, in accordance with aspects of the present disclosure.

The method 180 includes removably coupling or engaging the battery pack 104 to the connected charger 106 (block 182). In certain embodiments, removably coupling the battery pack 104 may include guiding the battery interface 126 to mate with the connected charger interface 128 via one or more features that help guide, engage, or secure the battery pack 104 to the connected charger 106. The one or more features may include various ridges, rails, guides, tabs, buttons, clips, or any other fastening or securing features known in the art to securely and removably couple the battery pack 104 to a charging device. In certain embodiments, one or more battery packs 104 may be removably coupled to the connected charger 106 either simultaneously or consecutively.

As noted above, the connected charger 106 may be configured to store information within the memory 132. For example, the memory 132 may include information related to a specific battery pack 104 and/or power tool 102, or a large amount of information regarding a plurality of power tools 102 and/or battery packs 104. Accordingly, in certain embodiments, the method 180 includes determining if any information for the battery pack 104 that is currently coupled to the connected charger 106 is stored within the memory of the connected charger 106 (block 184). In certain embodiments, the connected charger 106 may store the information until it is determined that a desired battery pack 104 is connected to the connected charger 106. If the desired battery pack 104 is not connected, the connected charger 106 may continue to store the information. If the appropriate battery pack 104 is connected to the connected charger 106, the relevant information is transferred from the connected charger 106 to the battery pack 104 (block 186).

The method 180 includes charging the battery pack 104 via the connected charger 106 (block 188). It should be noted that in certain embodiments, the connected charger 106 may charge the battery pack 104 at any time the battery pack 104 is removably coupled to the connected charger 106. In certain embodiments, the connected charger 106 may be configured to charge the battery pack 104 after information from the battery pack 104 is transferred to the connected charger 106.

The method 180 further includes disconnecting (or disengaging) the battery pack 104 from the connected charger 170 (block 190). In certain embodiments, the method 180 includes determining if the battery pack 104 is securely disengaged from the connected charger 106 (block 192) as a safety check and/or as a status check (block 192). If the battery pack 104 is not securely disconnected from the connected charger 106, the connected charger 106 may check again until the battery pack 104 is securely disengaged.

In certain embodiments, the method 180 includes the connected charger 106 receiving information (e.g., a command signal, firmware, configurations, updates, packages, lockdown commands and/or unlock commands for the battery pack 104, a block command, a shutdown or startup command, firmware updates for the battery pack 104 and/or the power tool 102, exchange of security certificates, confirmation parameters, etc.) from the cloud-based computing system 105 (block 194). For example, in certain embodiments, the cloud-based computing system 105 may send information to the connected charger 106 related to or associated with one or more power tools 102 and/or battery packs 104. In certain embodiments, the cloud-based computing system 105 may send information for a particular group of power tools 102 and/or battery packs 104, where the grouping is based on one or more grouping factors such as, but not limited to: geographical location of power tools 102, operator, job site, age of power tool 102, predictive maintenance required, duration of operation, amount of charge left in battery pack 104, etc. In certain embodiments, the information may be generated based in part on the information received from the connected charger 106 about the battery pack 104 and/or the power tool 102. For example, if the information is indicative of a potential problem (e.g., malfunction, theft, etc.), the cloud-based computing system 105 may be configured to send a lockdown command signal to lockdown the battery pack 104 and prevent further operations. As a further example, the information may include an operating command to control or regulate an operating parameter of the power tool 102 and/or the battery pack 104.

Further, in certain embodiments, the method 180 may include (not shown) transferring the information from the battery pack 104 to a desired power tool 102. In certain embodiments, the method 180 includes removably recoupling or coupling one or more battery packs 104 to the connected charger 106 so that additional information may be transferred to the battery pack 104 from the cloud-based computing system (block 182). In this manner, the connected charger 106 may provide information to a plurality of power tools 102 and/or battery packs 104.

The embodiments described herein represent a significant technological improvement in the field of the control, monitoring, and/or operation of power tools. For example, one or more embodiments provide wireless communications between a power tool and one or more components or computing systems (e.g., control systems), for example, which may be located on a construction job site or which may be remotely located from the power tool and/or job site. This wireless communications capability may be integrated into the battery charging and/or battery pack features of the tool. In one embodiment, information may be conveniently and efficiently exchanged between a battery charger, a battery pack, and/or control circuitry of the power tool. The information may be used as a basis for monitoring and/or controlling the power tool and/or its battery pack(s).

The control system (mentioned above) may be a locally located computing system (e.g., computer, tablet, laptop, workstation, etc.) relative to the power tool or a charger and/or may be a network-connected system such as, but not limited to, a cloud-based computing system as previously described. While communications may take place through a cellular network in some embodiments, other embodiments may wirelessly communicate using one or more other methods, e.g., WiFi, Bluetooth, satellite, UHF, VHF, WLANs, Wi-Fi, etc. In a Bluetooth embodiment, communications may take place between a connected charger and/or its battery pack and a smart phone executing a tool-related application. The smart phone may then communicate the received information to a computing system as described herein.

Communicating information to the control system may allow the control system to monitor the status and operation of the power tool, for example, to coordinate its use at a construction site or at another time. In one implementation, a charging device of the power tool may recharge one or more of its battery packs. The charging device may be configured to support bidirectional communication of information between or among the power tool, its battery packs, and one or more remote computing devices. This bidirectional communication capability may allow the control system to remotely determine the status or control the operation of the power tool, in addition to performing its monitoring capabilities.

The methods, processes, and/or operations described herein may be performed by code or instructions to be executed by a computer, processor, controller, or other signal processing device. The computer, processor, controller, or other signal processing device may be those described herein or one in addition to the elements described herein.

Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

The controllers, processors, devices, modules, units, logic, interfaces, and other signal generating and signal processing features of the embodiments disclosed herein may be implemented, for example, in non-transitory logic that may include hardware, software, or both. When implemented at least partially in hardware, the controllers, processors, devices, modules, units, logic, interfaces, and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, processors, devices, modules, units, logic, interfaces, and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

This written description uses examples to disclose the invention, including the best mode, and also to enable any person skilled in the art to practice the invention, including making and using any devices or systems and performing any incorporated methods. The patentable scope of the invention is defined by the description, and may include other examples that occur to those skilled in the art. Such other examples are intended to be within the scope of the description if they have structural elements that do not differ from the literal language of the description, or if they include equivalent structural elements with insubstantial differences from the literal language of the description. The embodiments may be combined to form additional embodiments.

What is claimed:

1. A system, comprising:

a plurality of battery packs associated with a plurality of different power tools, each battery pack configured to receive and gather respective battery pack and power tool operational information; and a connected charger having a housing and configured to removably couple with at least one of the plurality of battery packs via a first interface, the first interface including electrical power contacts and separate data contacts configured to transfer power between the connected charger and the coupled battery pack and to transfer the respective battery pack and power tool operational information of the coupled battery pack directly to charger circuitry of the connected charger, wherein the connected charger comprises:

a charger memory disposed within the housing of the connected charger and forming part of the charger circuitry, the charger memory configured to actively collect, receive and store, independently of any memory of any of the plurality of battery packs, the respective battery pack and power tool operational information via the data contacts of the first interface;

a communications module disposed within the housing of the connected charger and operatively coupled to the charger memory, the communications module comprising a wireless transceiver and being configured to access the respective battery pack and power tool operational information stored in the charger memory and to transmit the accessed information to a cloud-based computing system even during a period of time when the respective battery pack is physically disconnected from the first interface and is not in electrical communication with the connected charger; and a charger controller operatively coupled to the charger memory, the charger controller being configured to actively collect and write the respective battery pack and power tool operational information into the charger memory during multiple, consecutive coupling events with the plurality of battery packs and to retain the written operational information in the charger memory after each battery pack is decoupled, such that the connected charger maintains a multi-session operational history corresponding to the plurality of power tools and the respective battery packs;

wherein the communications module is further configured to access the multi-session operational history from the charger memory and to transmit the accessed history to the cloud-based computing system when wireless communication becomes available, including after periods during which wireless communication is unavailable and the multi-session operational history remains stored in the charger memory;

wherein the charger controller is further configured to group or organize the multi-session operational history based on one or more grouping factors before the communications module transmits the grouped or organized multi-session operational history to the cloud-based computing system, and wherein the one or more grouping factors comprise at least one of geographical location of the power tools, operator, job site, age of the power tool, predictive maintenance required, duration of operation, and amount of charge left in a battery pack.

2. The system of claim 1, comprising another battery pack of the plurality of battery packs configured to removably couple with the connected charger via the first interface, wherein the connected charger is configured to charge the another battery pack while transmitting the stored battery pack and power tool operational information from the charger memory.

3. The system of claim 1, comprising charging the battery pack of the plurality of battery packs via the connected charger while the battery pack is connected to the first interface.

4. The system of claim 1, wherein the wireless transceiver is a cellular transceiver having a cellular antenna.

5. The system of claim 1, wherein the power tool operational information comprises unique identification information related to the power tool or unique identification information related to the manufacturer, owner, and/or previous owners of the power tool, or a combination thereof.

6. The system of claim 1, wherein the power tool operational information comprises historical information related to an operation of the power tool, historical information related to the repair and/or theft of the power tool, historical information related to error codes or alerts triggered by the power tool, or a combination thereof.

7. The system of claim 1, wherein the power tool operational information comprises sensor related information gathered from one or more sensors disposed throughout the power tool, information related to tool components of the power tool, or a combination thereof.

8. The system of claim 1, wherein the battery pack operational information includes unique identification information related to the battery pack, historical information related to the operation of the battery pack, cycles of operation, a power level, a state of health (SOH) status, a state of charge (SOC) status, historical information related to error codes, a lockdown status, an unlock status, or a combination thereof.

9. The system of claim 1, wherein a battery pack of the plurality of battery packs is a rechargeable battery pack comprising a series of rechargeable battery cells.

10. The system of claim 6, wherein the historical information related to the operation of the power tool comprises information related to runtime.

11. The system of claim 1, wherein the communications module is configured to transmit the stored information in bulk to the cloud-based computing system.

12. The system of claim 1, wherein the communications module is configured to transmit information associated with a battery pack that is not connected to the connected charger at the time of transmission.

13. The system of claim 1, wherein the communications module is configured such that the connected charger transmits information to the cloud-based computing system without use of a mobile phone, tablet, computer, and processor-enabled gateway device.

14. The system of claim 1, wherein the communications module is configured to selectively transfer information associated with a particular battery pack, a particular power tool, and a particular group of battery packs and power tools.

15. The system of claim 1, wherein the communications module is configured to transmit the stored information at a desired predetermined time.

* * * * *